United States Patent
Kusuyama (10) Patent No.: US 7,561,335 B2
(45) Date of Patent: Jul. 14, 2009

(54) OPTICAL LENS AND SEMICONDUCTOR LASER APPARATUS

(75) Inventor: Yutaka Kusuyama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 470 days.

(21) Appl. No.: 11/401,320

(22) Filed: Apr. 11, 2006

(65) Prior Publication Data

US 2006/0181778 A1    Aug. 17, 2006

Related U.S. Application Data

(62) Division of application No. 10/476,989, filed as application No. PCT/JP02/04495 on May 8, 2002, now Pat. No. 7,145,724.

(30) Foreign Application Priority Data

May 9, 2001    (JP)    ............. P2001-139228

(51) Int. Cl.
    *G02B 27/10*    (2006.01)
(52) U.S. Cl. ................... 359/619; 359/623
(58) Field of Classification Search ......... 359/618–623, 359/628, 455, 741–743, 733; 65/111, 403, 65/433, 435; 264/1.29, 1.32, 2.7
See application file for complete search history.

(56) References Cited

U.S. PATENT DOCUMENTS

| | | | |
|---|---|---|---|
| 2,151,573 A | 3/1939 | Stanley | ............ 88/39 |
| 4,163,370 A * | 8/1979 | Kurth | ............ 65/402 |
| 4,767,172 A | 8/1988 | Nichols et al. | |
| 4,986,939 A | 1/1991 | Hoffmann | ............ 264/1.7 |
| 5,004,328 A | 4/1991 | Suzuki et al. | ............ 350/416 |
| 5,013,143 A | 5/1991 | Pasco | ............ 350/432 |

(Continued)

FOREIGN PATENT DOCUMENTS

EP    0 752 394 A2    1/1997

(Continued)

OTHER PUBLICATIONS

International Appklication No. PCT/JP02/04495 International Preliminary Examination Report (English Translation).

*Primary Examiner*—Joseph Martinez
(74) *Attorney, Agent, or Firm*—Drinker Biddle & Reath LLP (57) ABSTRACT

The optical lens 1 in accordance with the present invention comprises an optically effective part 5, formed as a curved surface in at least one of light-entrance and light-exit faces, for acting in an X-axis direction on light emitted from a light-emitting device; and a pair of protrusions 10, integrally formed in the face on the side provided with the optically effective part 5, projecting in an optical axis direction on both sides of a light-transmitting area; the pair of protrusions 10 projecting beyond a surface of the optically effective part. Such an optical lens 1 can prevent the optically effective part 5 from coming into direct contact with an arrangement surface where the optical lens 1 is placed, side faces of members adjacent to the optical lens 1, and the like in each manufacturing step, during delivery, and so forth, whereby the optically effective part 5 is hard to incur damages and the like.

7 Claims, 5 Drawing Sheets

U.S. PATENT DOCUMENTS

| | | | | |
|---|---|---|---|---|
| 5,080,706 | A | 1/1992 | Snyder et al. | 65/102 |
| 5,081,639 | A | 1/1992 | Snyder et al. | 372/101 |
| 5,155,631 | A | 10/1992 | Snyder et al. | 359/708 |
| 5,293,269 | A | 3/1994 | Burkhart et al. | 359/719 |
| 5,513,201 | A | 4/1996 | Yamaguchi et al. | 372/75 |
| 5,596,671 | A | 1/1997 | Rockwell, III | |
| 5,745,519 | A | 4/1998 | Ruda et al. | 372/101 |
| 5,790,576 | A | 8/1998 | Waarts et al. | 372/43 |
| 5,867,327 | A | 2/1999 | Snyder | 359/710 |
| 5,900,981 | A | 5/1999 | Oren et al. | |
| 6,222,864 | B1 | 4/2001 | Waarts et al. | 372/43 |
| 6,384,981 | B1 | 5/2002 | Hauschild | 359/622 |
| 6,416,237 | B2 * | 7/2002 | Lissotschenko et al. | 385/88 |
| 6,471,372 | B1 | 10/2002 | Lissotschenko et al. | 362/268 |
| 6,545,811 | B1 | 4/2003 | Fujimoto | 359/619 |
| 6,621,631 | B2 | 9/2003 | Lissotshenko et al. | 359/566 |
| 7,419,415 | B2 * | 9/2008 | Jousse | 445/24 |
| 2001/0043779 | A1 | 11/2001 | Lissotschenko et al. | 385/88 |
| 2002/0102071 | A1 | 8/2002 | Lissotschenko et al. | 385/88 |
| 2002/0129621 | A1 | 9/2002 | Kusuyama | 65/61 |
| 2002/0191296 | A1 | 12/2002 | Kusuyama | 359/619 |

FOREIGN PATENT DOCUMENTS

| | | |
|---|---|---|
| EP | 1 006 382 A1 | 6/2000 |
| GB | 2 108 483 A | 5/1983 |
| JP | 57-145040 | 9/1982 |
| JP | 57-169706 | 10/1982 |
| JP | 57-175739 | 10/1982 |
| JP | 57-181516 | 11/1982 |
| JP | 57-183328 | 11/1982 |
| JP | 58-168026 | 10/1983 |
| JP | 59-092935 | 5/1984 |
| JP | 63-008233 | 1/1988 |
| JP | 02-311801 | 12/1990 |
| JP | 06-2311 | 1/1994 |
| JP | 06-15016 | 2/1994 |
| JP | 07-15521 | 2/1995 |
| JP | 07-098402 | 4/1995 |
| JP | 07- 287104 | 10/1995 |
| JP | 07-291651 | 11/1995 |
| JP | 9-118532 | 5/1997 |
| JP | 10-001321 | 1/1998 |
| JP | 10-096803 | 4/1998 |
| JP | 10-245236 | 9/1998 |
| JP | 11-125702 | 5/1999 |
| JP | 11-216761 | 8/1999 |
| JP | 2000-501518 | 2/2000 |
| JP | 2000-098191 | 4/2000 |
| JP | 3121614 | 1/2001 |
| WO | WO 92/06046 | 4/1992 |
| WO | WO 97/21126 | 6/1997 |
| WO | WO 00/19248 | 4/2000 |
| WO | WO 01/35125 A1 | 5/2001 |
| WO | WO 01/35126 A1 | 5/2001 |
| WO | WO 01/35145 A1 | 5/2001 |
| WO | WO 01/35147 A1 | 5/2001 |
| WO | WO 02/090274 A1 | 11/2002 |

* cited by examiner

OPTICAL LENS AND SEMICONDUCTOR LASER APPARATUS

This is a divisional application of copending application Ser. No. 10/476,989, filed on Nov. 7, 2003, now U.S. Pat. No. 7,145,724 which is a national stage entry of International Application No. PCT/JP02/04495 filed on May 8, 2002, each being incorporated by reference herein in its entirety.

TECHNICAL FIELD

The present invention relates to an optical lens acting on light emitted from a light-emitting device.

BACKGROUND ART

In a conventional type optical lens, there has been a case where an optically effective part, which is a part collimating or converging incident light, comes into contact with an arrangement surface where the optical lens is placed, side faces of members adjacent to the lens, and the like in each manufacturing step or during delivery.

DISCLOSURE OF THE INVENTION

Such a conventional type optical lens has been problematic in that the optically effective part may be damaged upon coming into contact with the arrangement surface where the optical lens is placed or other members, thus deteriorating performances of outgoing light.

In order to overcome the problem mentioned above, it is an object of the present invention to provide an optical lens whose optically effective part is hard to damage, thus being excellent in performances of outgoing light.

An optical lens in accordance with the present invention is an optical lens acting on respective light components emitted from a plurality of light-emitting parts of a light-emitting device, and then emitting the light components; the optical lens comprising an optically effective part, formed as a plurality of curved surfaces on at least one of light-entrance and light-exit faces, for acting in an X-axis direction on the respective light components emitted from the light-emitting parts of the light-emitting device; and a pair of protrusions, integrally formed in the face on the side provided with the optically effective part, projecting in an optical axis direction on both sides of a light-transmitting area; the pair of protrusions projecting beyond a surface of the optically effective part.

Since a pair of protrusions projecting beyond the surface of the optically effective part are formed on both sides of the light-transmitting area, such an optical lens can prevent its optically effective part from coming into direct contact with the arrangement surface where the optical lens is placed, side faces of members adjacent to the optical lens, and the like in each manufacturing step, during delivery, or the like, whereby the optically effective part is hard to incur damages and the like.

Also, since a pair of protrusions are integrally formed, another optical lens can be placed there.

Here, "X-axis direction" refers to a direction intersecting a stacking direction (hereinafter referred to as "Y-axis direction") of an active layer and a cladding layer in a semiconductor laser device acting as the light-emitting device and an optical axis direction of light emitted by the light-emitting parts. Also, "acting on light" means collimating or converging the incident light.

A pair of protrusions may be formed integrally in the light-entrance and light-exit faces so as to project in the optical axis direction on both sides of the light-transmitting area. This makes it possible to place separate optical lenses on both light-entrance and light-exit sides.

The optically effective part may be formed as a plurality of curved surfaces arranged in contact with each other. This makes it possible to act on individual light components emitted from a light-emitting device comprising a plurality of light-emitting parts.

The optically effective part may be formed in the light-entrance and light-exit faces. This enables a telescope configuration or Fourier configuration.

In place of the optically effective part, formed as curved surfaces in the light-entrance and light-exit faces, for acting in the X-axis direction on the light emitted from the light-emitting device in the above-mentioned optical lens, the optical lens in accordance with the present invention may comprise an optically effective part, formed as curved surfaces in the light-entrance and light-exit faces, for rotating the light emitted from the light-emitting device and then emitting thus rotated light.

Such an optical lens yields outgoing light subjected to a rotating action with respect to the incident light. If the incident light has already been collimated with respect to the Y-axis direction intersecting the X-axis direction and optical axis direction, a position at which the light components emitted from the light-emitting device are superposed on each other can be located farther.

Preferably, the optically effective part rotates the light emitted from the light-emitting device by 90° about the optical axis and then emits thus rotated light.

The optical lens may further comprise a Y-axis effective optical lens, attached to the protrusion of the optical lens, for acting in the Y-axis direction intersecting the X-axis direction and optical axis direction.

Such an optical lens yields outgoing light subjected to an action in the Y-axis direction.

The curved surface may be formed by an aspheric surface.

The semiconductor laser apparatus in accordance with the present invention comprises a semiconductor laser device; and the optical lens for acting on respective light components emitted from light-emitting parts of the semiconductor laser device and then emitting the light components.

This realizes a semiconductor laser apparatus comprising an optical lens whose optically effective part is hard to damage.

As explained in the foregoing, the optical lens in accordance with the present invention is an optical lens having a pair of side faces opposing each other for receiving and emitting light; the optical lens comprising an optically effective part, provided with at least one of the pair of side faces, including a plurality of curved surfaces acting in a predetermined direction on incident light; and a pair of protrusions, formed at a side face on the side provided with the optically effective part, projecting in a direction intersecting the side face; the pair of protrusions projecting beyond a surface of the optically effective part. Therefore, the optically effective part can be prevented from coming into direct contact with an arrangement surface where the optical lens is placed, side faces of members adjacent to the optical lens, and the like, whereby the optically effective part is hard to incur damages and the like.

The present invention will become more fully understood from the detailed description given hereinbelow and the accompanying drawings. They are given by way of illustration only, and thus should not be considered limitative of the present invention.

BRIEF DESCRIPTION OF THE DRAWINGS

FIG. 4A is a view showing a state where an optical lens is placed with its optically effective part facing down, whereas

BEST MODES FOR CARRYING OUT THE INVENTION

In the following, optical lenses and semiconductor laser apparatus in accordance with embodiments of the present invention will be explained in detail with reference to the drawings. In the following explanation, parts identical or equivalent to each other will be referred to with numerals identical to each other without repeating their overlapping descriptions.

FIGS. 1A to 1C and 2A to 2E are overall views of optical lenses in accordance with embodiments, respectively. In these embodiments, the X-axis direction, Y-axis direction, and optical axis direction in the drawings are assumed to be orthogonal to each other. In the optical lens 1 shown in FIG. 1A, respective light components emitted from light-emitting parts of a semiconductor laser device (not depicted) acting as a light-emitting device are collimated in the X-axis direction by an optically effective part 5, and thus collimated light is emitted therefrom. The optically effective part 5 is formed as a convex surface in the light-entrance face. This convex surface is one in which all given cross sections perpendicular to the Y-axis direction have the same arc form. Such a curved surface will hereinafter be referred to as "a curved surface parallel to the Y-axis direction". The optically effective part 5 in the optical lens 1 is formed by five convex surfaces arranged in contact with each other while being parallel to the Y-axis direction, and is adaptable to a semiconductor laser device comprising five light-emitting parts.

Figure 1A:
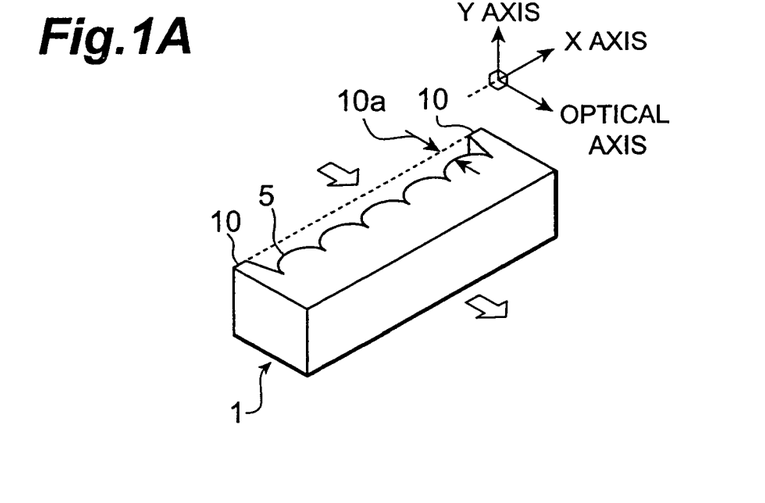
FIGS. 1A to 1C are overall views of optical lenses in accordance with embodiments, respectively.

A pair of protrusions 10 projecting in the optical axis direction are integrally formed on both sides of the light-transmitting area of the optical lens 1 (the light-transmitting area being the optically effective part 5 in the case of the optical lens 1). The pair of protrusions 10 are designed so as to become higher than the surface of the optically effective part 5 by a projection amount 10a. This can prevent the optically effective part 5 from incurring damages and the like. Also, another optical lens may be placed at the pair of protrusions 10. These points will later be explained in detail. The pair of protrusions 10 may also be formed at the surface not formed with the optically effective part 5 (on both sides of the light-transmitting area in the light-exit face in the case of the optical lens 1). This makes it possible to place another optical lens on the side not formed with the optically effective part 5.

Figure 1B:
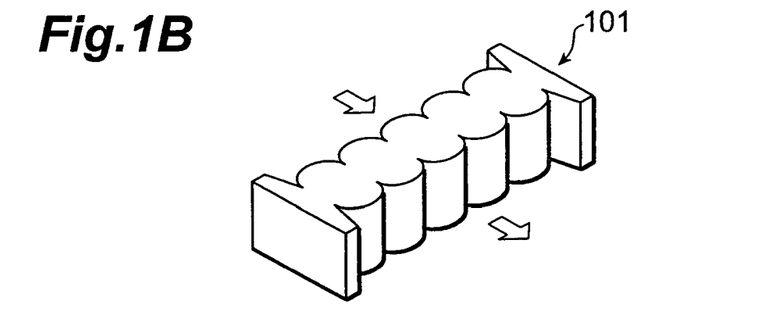

For example, the optical lens in accordance with an embodiment may be one in which the optically effective part 5 acting in the X-axis direction is formed in the light-entrance and light-exit faces as in the optical lens 101 shown in FIG. 1B. A pair of protrusions 10 are formed on both sides of the light-transmitting area in the light-entrance and light-exit faces. This optical lens 101 allows the optically effective part 5 to be formed into a telescope configuration or Fourier configuration. In the following, FIGS. 2 and 3 will be explained while taking the optical lens 101 as an example.

Figure 1C:
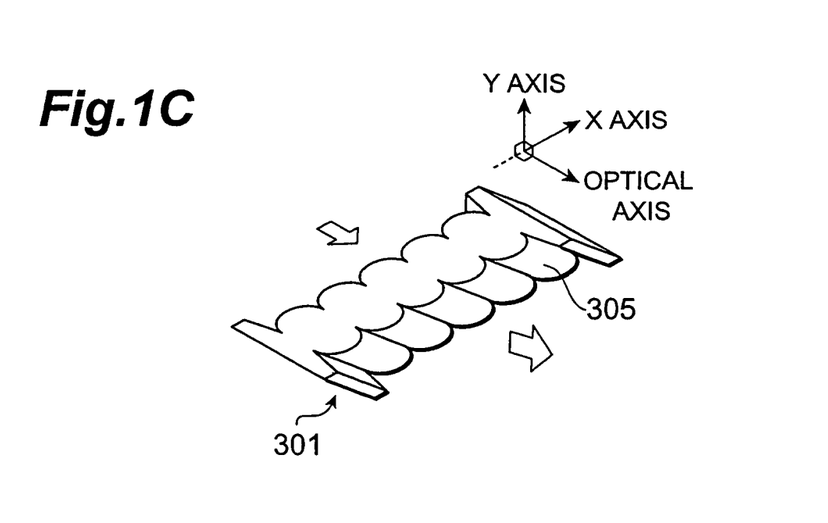

As in the optical lens 301 shown in FIG. 1C, an optically effective part 305 constituted by five convex surfaces parallel to "a direction forming 45° with respect to the Y-axis direction and optical axis direction" may be provided in place of the optically effective part 5 of the optical lens 101 shown in FIG. 1B. The optical lens 301 can rotate the incident light by 90° about the optical axis and then emit thus rotated light.

Figures 2A, 2B:
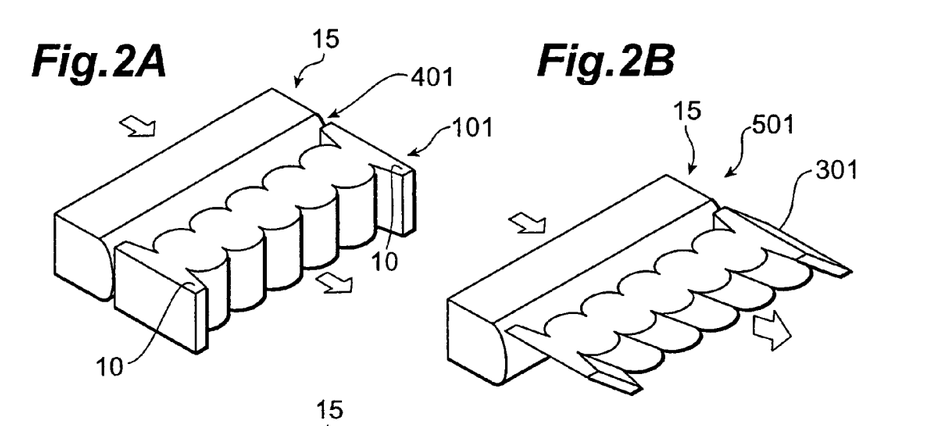
FIGS. 2A to 2E are overall views of optical lenses in accordance with embodiments, respectively.

As with the optical lens 401 shown in FIG. 2A, an optical lens may be constituted by the optical lens 101 and a Y-axis effective optical lens 15, disposed parallel to the optical lens 101, for collimating the light in the Y-axis direction. The Y-axis effective optical lens 15 is attached to a pair of protrusions 10 while being bonded thereto. Since the projections 10 are integrated with the optical lens 101 while being set with a predetermined projection amount 10a, spacers, side tabs, and the like for attaching the Y-axis effective optical lens 15 are unnecessary (though a side tab or the like may be used for stabilizing the attachment as will be explained later), and it is easy to adjust the position where the Y-axis effective optical lens 15 is placed. This optical lens 401 yields the outgoing light collimated in both X- and Y-axis directions.

As with the optical lens 501 shown in FIG. 2B, an optical lens may be constituted by the optical lens 301 and a Y-axis effective optical lens 15, disposed parallel to the optical lens 301, for collimating the light into the Y-axis direction. Since the optical lens 301 rotates by 90° the individual light components collimated in the Y-axis direction and then emits thus rotated light components, the outgoing light components are not superposed on each other in the X-axis direction.

Figures 2C, 2D:
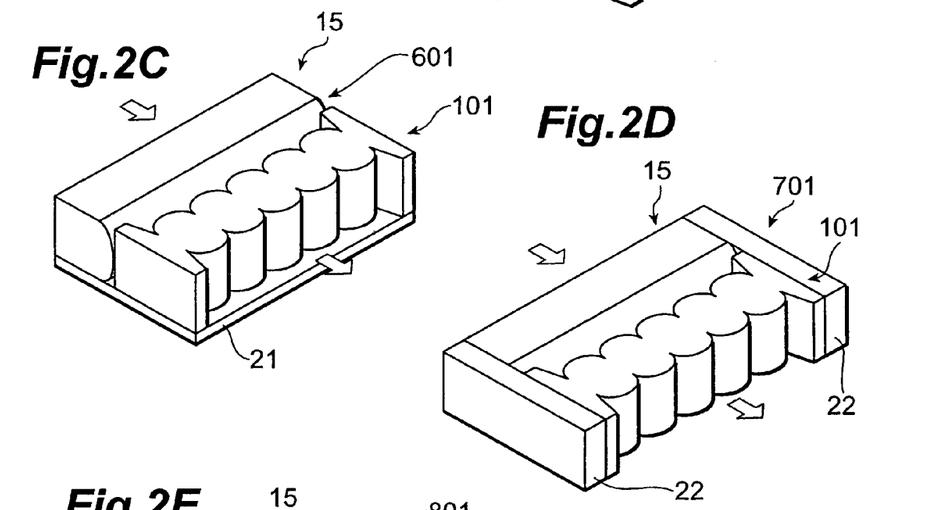

As with the optical lens 601 shown in FIG. 2C, an optical lens may be constituted by the optical lens 101; a Y-axis effective optical lens 15, disposed parallel to the optical lens 101, for collimating the light into the Y-axis direction; and a mounting plate 21 for mounting the optical lens 101 and the Y-axis effective optical lens. Using the mounting plate 21 can fix the positional relationship between the lenses 101, 15 and facilitate the arrangement.

Figure 2E:
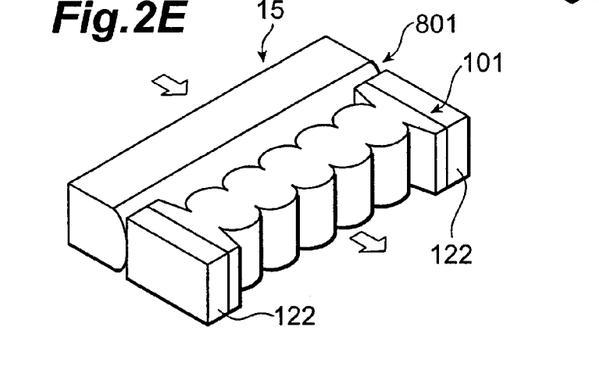

As with the optical lenses 701, 801 shown in FIGS. 2D and 2E, an optical lens may be constituted by the optical lens 101; a Y-axis effective optical lens 15, disposed parallel to the optical lens 101, for collimating the light into the Y-axis direction; and a pair of side tabs 22, 122 coming into contact with the optical lens 101 and Y-axis effective optical lens sideways. Using the side tabs 22, 122 can fix the positional relationship between the lenses 101, 15 and facilitate the arrangement.

Though each of the curved surfaces of optically effective parts in the optical lenses 1, 101, 301 to 801 in accordance with these embodiments is formed as a convex surface, it can also be formed as a concave surface. The curved surface may be an aspheric surface as well.

Figure 3A:
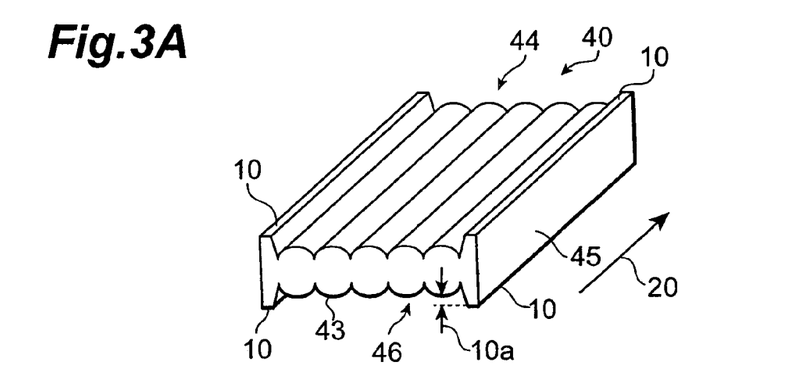
FIGS. 3A to 3C are schematic views showing respective steps in the method of making an optical lens in accordance with an embodiment.
Figures 3B, 3C:
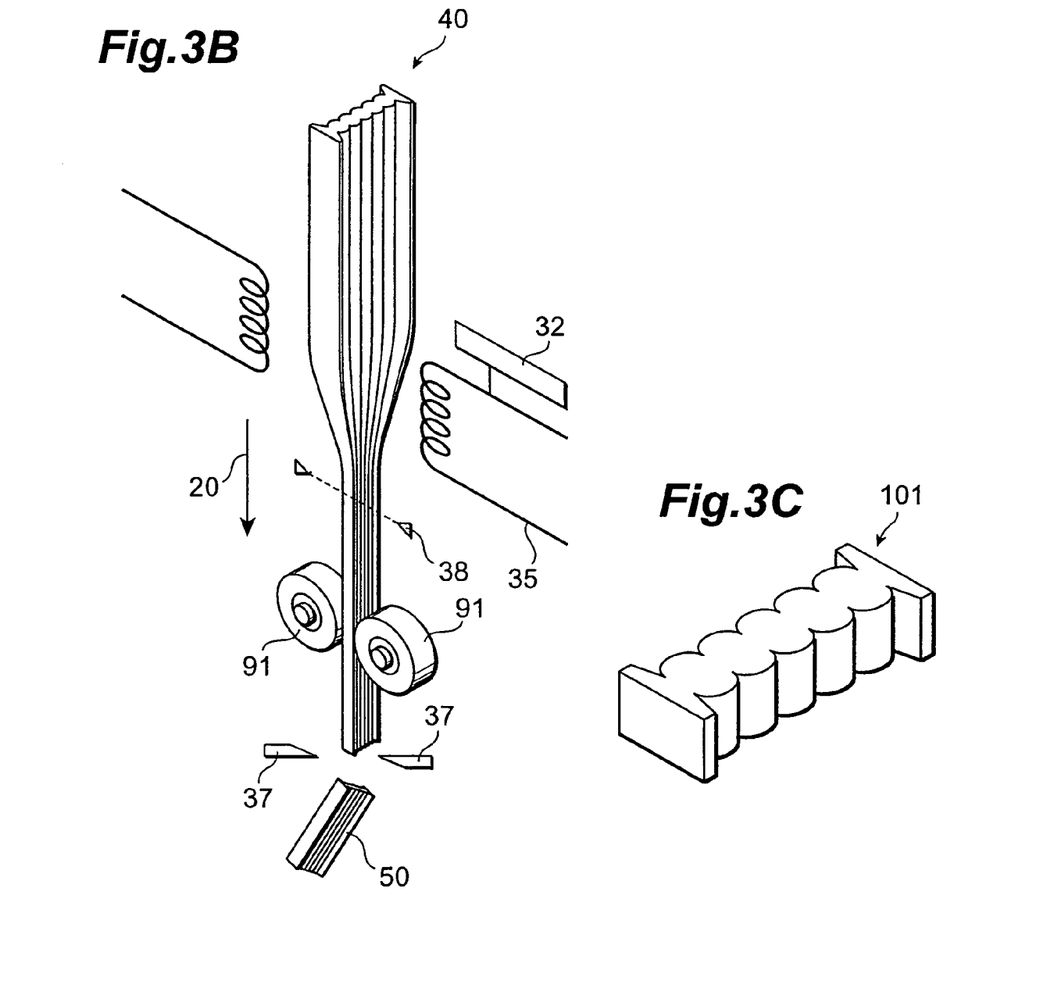

FIGS. 3A to 3C are schematic views showing respective steps in the method of making an optical lens in accordance with an embodiment. The optical lens 101 is manufactured, for example, by drawing as shown in the following. For manufacturing, as shown in FIG. 3A, an optical member made of a light-transparent glass material is initially prepared and shaped into a columnar form having a first side face 44 and a second side face 46, which is employed as an optical lens matrix 40. As the light-transparent glass material, BK7 ((manufactured by Schott) having a refractive index of 1.52, a thermal expansion coefficient of $71 \times 10^{-7}$/K, and a yield point of 614□) is used, for example. The first side face 44 and second side face 46 are formed parallel to a column axis direction 20.

Each of the first side face 44 and second side face 46 is formed with a plurality of curved surfaces 43 which are parallel to the column axis direction 20 and are in contact with each other. The plurality of curved surfaces 43 are parts functioning as an optically effective part 5 acting on incident light or outgoing light after drawing.

A pair of protrusions 10 are further formed on both sides of the first side face 44 and second side face 46. The protrusions 10 are formed so as to become higher by a projection amount 10*a* than the curved surfaces formed in the first side face 44 and second side face 46. The protrusions 10 of the optical lens matrix 40 will finally become the protrusions 10 of the optical lens 101 (thus being referred to with the same numeral). The protrusions 10 of the optical lens matrix 40 function to protect the curved surfaces 43 against the influence of heating in the drawing step. Though corners of a matrix which is an object to be drawn are more susceptible to heating in the drawing step, so that deformations and the like are likely to occur at the corners as a result of drawing, a pair of protrusions 10 are formed in the optical lens matrix 40 in accordance with this embodiment, so as to be affected by the heating instead, whereby a plurality of curved surfaces 43 (to become the optically effective part 5) are less susceptible to heating.

As already explained with reference to FIGS. 2A and 2B, the projections 10 in the optical lens 101 also function as attachments for attaching the Y-axis optical lens 15 at a position separated from the surface of the optically effective part 5 by the projection amount 10*a*. Therefore, the projection amount 10*a* of the protrusions 10 of the optical lens matrix 40 is determined while taking account of the influence of heating (which is usually the ratio of reduction caused by deformation upon heating).

Thus, the form of an optical lens to be manufactured, the form of the optically effective part in particular, can be made in the stage of the optical lens matrix 40 having sufficiently large dimensions (e.g., having a width and height of 2 to 6 cm each and a length of 20 to 200 cm) in the method of making an optical lens by drawing, whereby these operations can be carried out in a simple and accurate manner.

Subsequently, as shown in FIG. 3B, the optical lens matrix 40 shaped by the above-mentioned step is heated to the yield point of the glass material or higher by an electric furnace 35 or the like acting as heating means, and drawing is carried out so as to attain desirable dimensions. Preferably, the electric furnace 35 has an annular form so as to surround the optical lens matrix 40 and uniformly heat the optical lens matrix 40 from thereabout. A temperature adjusting device 32 is connected to the electric furnace 35, whereby the temperature of the electric furnace 35 can be changed so as to adjust the drawing temperature.

For expanding the heated optical lens matrix 40 by drawing, feeding rollers (not depicted) for feeding the optical lens matrix 40 into the electric furnace 35 and pulling rollers 91 for pulling the optical lens matrix 40 are used. Adjusting the rotating speed of the feeding rollers can determine the total amount of heat received by the optical lens matrix 40 as well. When drawing the optical lens matrix 40 having the columnar form mentioned above, the optical lens matrix 40 can be prevented from twisting during the drawing if the optical lens matrix 40 is held by the feeding rollers and the pulling rollers 91 before and after the drawing, respectively. In particular, the optical lens matrix 40 has a pair of protrusions 10 in the first side face 44 and second side face 46, whereby the pulling rollers 91 can stably hold the optical lens matrix 40 by way of the pair of protrusions 10 as shown in FIG. 3B, and thus prevent the optical lens matrix 40 from wobbling at the time of drawing.

When it is determined that a desirable dimension (e.g., 0.5 to 15 mm) is attained as a result of drawing, the optical lens matrix 40 is cut by cutter devices 37 placed under the pulling rollers 91, whereby a preform 50 having a length of 5 mm to 2000 mm is obtained. This preform 50 is further cut into a desirable size, whereby the optical lens 101 shown in FIG. 3C is made. The dimension is determined by a diameter meter 38 placed upstream the pulling rollers 33. The diameter meter 38 comprises a laser unit, a light-receiving unit, and an analyzing unit. The light emitted from the laser unit is transmitted through the drawn optical lens matrix 40. Thus transmitted light is received by the receiving unit. From thus received light quantity and the like, the dimension of the drawn optical lens matrix 40 is calculated by the analyzing unit. The result of calculation is transmitted to a control unit which is not depicted. If the desirable dimension is attained, the cutter devices 37 are driven. If the desirable dimension is not attained, drawing environments (feeding roller rotating speed, drawing temperature, etc.) are adjusted.

When making an optical fiber or the like by drawing, the drawn product is taken up by a drum or the like. By contrast, the characteristic feature of the making of an optical lens lies in that thus drawn product is cut by the cutter devices 37 and the like.

Because of a characteristic feature of drawing, thus manufactured optical lens 101 has a cross-sectional form identical to that of the optical lens matrix 40. In particular, the form of a plurality of curved surfaces 43 produced by the initial optical lens matrix manufacturing step is maintained as it is after the drawing, so as to become the optically effective part 5, whereby no more shaping is necessary in the stage of minute elements after the drawing. The method of making the optical lens 101 in accordance with this embodiment is one in which the optical lens 101 comprising a plurality of curved surface parts 43 is manufactured by a single drawing step, and thus can greatly alleviate the burden in terms of manufacture.

Though Japanese Patent Publication No. 3121614 and U.K. Patent Application GB2108483A disclose methods of making microlenses by drawing, they are methods of making lenses acting on a single light component, and thus are different from a method of making an optical lens acting on a plurality of light components as in the present invention.

Though the method of making the optical lens 101 by drawing is explained in the foregoing, the optical lens 101 can also be made by press work, for example.

Figure 4A:
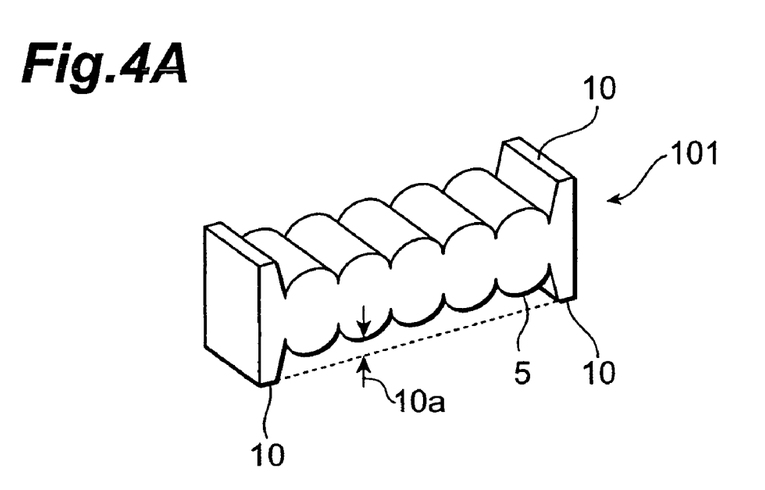
Figure 4B:
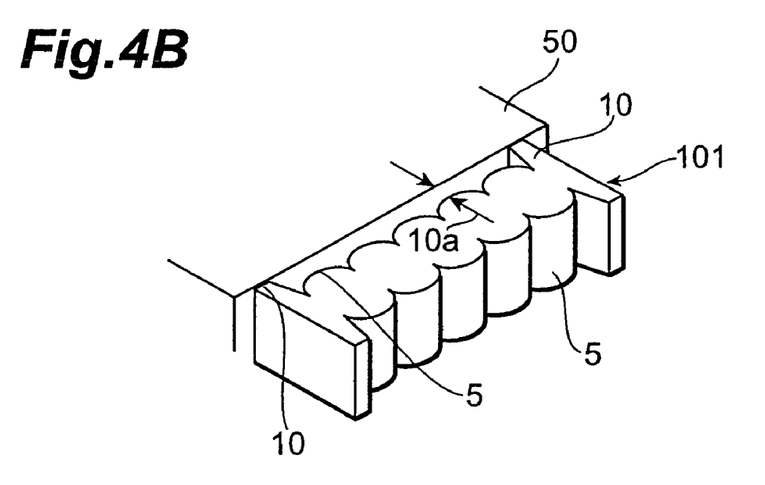
FIG. 4B is a view showing a state where another member is placed adjacent to the optically effective part of the optical lens.

FIG. 4A is a view showing an optical lens in a state arranged with its optically effective part facing down. FIG. 4B is a view showing a state where another member is placed adjacent to the optically effective part of the optical lens. Any of them is a state which may frequently occur in each manufacturing step or during delivery. As can be seen from FIG. 4A, the protrusions 10 project beyond the surface of the optically effective part 5 by the projection amount 10*a*, whereby the optically effective part 5 does not come into contact with the arrangement surface even when facing down. As can be seen from FIG. 4B, even when a member 50 is placed adjacent to (in contact with) the optically effective part 5, the optically effective part 5 does not come into contact with side faces of the member 50. Thus, the optically effective part 5 has a structure less likely to come into contact with others, whereby the optical lens 101 in accordance with this embodiment is hard to damage and less likely to deteriorate performances of the outgoing light.

Figure 5:
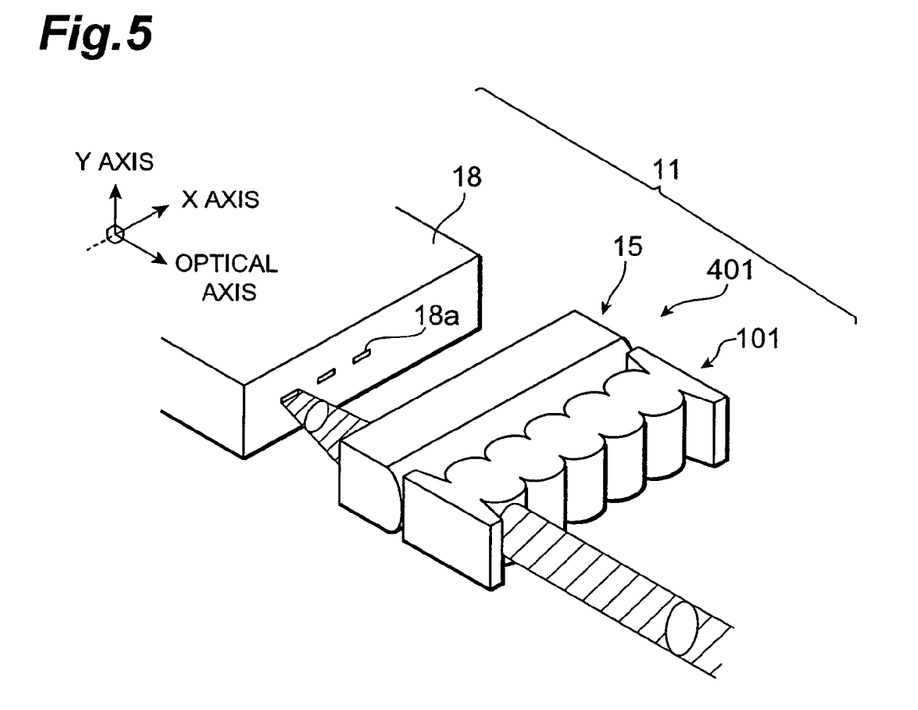
FIG. 5 is an overall view of a semiconductor laser apparatus in accordance with an embodiment.

FIG. 5 is an overall view of the semiconductor laser apparatus in accordance with an embodiment. This semiconductor laser apparatus 11 is constituted by a semiconductor laser device 18 and the optical lens 401. Respective light components emitted from light-emitting parts 18a of the semiconductor laser device 18 are collimated in the Y axis direction by the Y-axis effective optical lens 15 and in the X-axis direction by the optical lens 101, and then are emitted. Therefore, the optical lens 401 yields the outgoing light collimated in both X- and Y-axis directions. This semiconductor laser apparatus 11 is used as a laser processing apparatus, for example, by further providing a condenser lens and the like. Here, for finally converging light into a smaller light-collecting area, a severe accuracy is required for placing/adjusting these optical systems. The conventional type optical lenses have employed spacers, side tabs, lens barrels, and the like for adjustment, and thus have been problematic in that the process is complicated and that the number of components increases. In the semiconductor laser apparatus 11 in accordance with this embodiment, by contrast, a pair of protrusions 10 are integrally formed with the optical lens 101 so as to conform to the position where the Y-axis effective optical lens 15 for collimation in the Y-axis direction is placed, whereby the burden of arrangement/adjustment is alleviated, and the number of components is restrained from increasing.

As explained in the foregoing, the optical lens in accordance with the present invention is an optical lens having a pair of side faces opposing each other for receiving and emitting light; the optical lens comprising an optically effective part, provided with at least one of the pair of side faces, including a plurality of curved surfaces acting in a predetermined direction on incident light; and a pair of protrusions, formed at a side face on the side provided with the optically effective part, projecting in a direction intersecting the side face, the pair of protrusions projecting beyond a surface of the optically effective part. Therefore, the optically effective part can be prevented from coming into direct contact with an arrangement surface where the optical lens is placed, side faces of members adjacent to the optical lens, and the like, whereby the optically effective part is hard to incur damages and the like.

From the foregoing explanations of the invention, it will be obvious that the same may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

Since a pair of protrusions projecting beyond a surface of an optically effective part are formed on both sides of the light-transmitting area, the optical lens in accordance with the present invention can prevent the optically effective part from coming into direct contact with an arrangement surface where the optical lens is placed, side faces of members adjacent to the optical lens, and the like in each manufacturing step, during delivery, and so forth. This makes the optically effective part harder to damage, whereby an optical lens excellent in performances of outgoing light is provided.

Also, since a pair of protrusions are integrally formed with a predetermined projection height, another optical lens can be placed there. Namely, an optical lens alleviating the burden of arranging/adjusting another optical lens while restraining the number of components from increasing is provided.

The invention claimed is:

1. A method of manufacturing an optical lens by drawing an optical lens matrix having a pair of side faces extending in a longitudinal direction of the optical lens matrix and opposing each other, the optical lens matrix including a plurality of curved surfaces formed on at least one of the side faces and extending in the longitudinal direction, and a pair of protrusions formed at the side face provided with the curved surfaces and projecting beyond the curved surfaces and extending in the longitudinal direction, the method comprising:

drawing one end of the optical lens matrix in the longitudinal direction by a pair of rollers while gripping the protrusions of the optical lens matrix by the rollers; and cutting the drawn optical lens matrix in a direction intersecting the longitudinal direction.

2. The method according to claim 1, wherein one of the rollers is disposed so as to face one of the side faces and the other of the rollers is disposed so as to face the other of the side faces.

3. The method according to claim 1 further comprising measuring a dimension of the drawn optical lens matrix.

4. The method according to claim 1, wherein the protrusions are integrally formed on both ends of the curved surfaces.

5. The method according to claim 1, wherein each of the curved surfaces contacts an adjacent curved surface.

6. The method according to claim 1, wherein the curved surfaces are formed on both of the side faces.

7. The method according to claim 1, wherein each of the curved surfaces is an aspheric surface.

* * * * *